United States Patent [19]

Kates

[11] Patent Number: 4,852,175

[45] Date of Patent: Jul. 25, 1989

[54] HEARING AID SIGNAL-PROCESSING SYSTEM

[76] Inventor: James M. Kates, 632 E. Broad St., Westfield, N.J. 07090

[21] Appl. No.: 151,850

[22] Filed: Feb. 3, 1988

[51] Int. Cl.[4] ...................... H04R 25/00; H04B 15/00
[52] U.S. Cl. .................................... 381/68.4; 381/68; 381/71; 381/73.1; 381/94
[58] Field of Search ................... 381/68.4, 68, 71, 73, 381/94, 104–109

[56] References Cited

U.S. PATENT DOCUMENTS

| | | | |
|---|---|---|---|
| 3,989,904 | 11/1976 | Rohrer et al. | 381/68.4 |
| 4,025,721 | 5/1977 | Graupe et al. | 381/68.2 |
| 4,135,590 | 1/1979 | Gaulder | 381/94 |
| 4,185,168 | 1/1980 | Graupe et al. | 381/68 |
| 4,454,609 | 6/1984 | Kates | 381/68 |
| 4,508,940 | 4/1985 | Steeger | 381/68.4 |
| 4,596,902 | 6/1986 | Gilman | 381/68 |
| 4,630,302 | 12/1986 | Kryter | 381/68.4 |
| 4,630,304 | 12/1986 | Borth et al. | 381/68 |
| 4,680,798 | 7/1987 | Neumann | 381/68.4 |

FOREIGN PATENT DOCUMENTS 0252205 1/1988 European Pat. Off. .

OTHER PUBLICATIONS

Hearing Instruments, vol. 38, No. 11, Nov. 1987, p. 18–26, Staab, W. J., "Digital Hearing Instruments".
Hearing Instruments, vol. 38, No. 11, Nov. 1977, p. 28t, Widin, G. P., "The Hearing of Digital Technology".
French et al., Journal of the Acoustical Society of America, vol. 19, pp. 98–119, (1947).
Kryter, Journal of the Acoustical Society of America, vol. 34 (II) pp. 1689–1697 (1962).
McAulay et al., IEEE Transactions, ASSP-28, No. 2, pp. 137–145, (1980).

Primary Examiner—Jin F. Ng
Assistant Examiner—Danita R. Byrd

[57] ABSTRACT

A signal processing system for hearing aids estimates the absolute quantity of noise in each of a plurality of frequency bands. The audio gains are adjusted so as to minimize the effect of upward spread of masking, wherein noise in lower frequency bands decreases the intelligibility of speech sounds in higher frequency bands. The noise level in each frequency band is estimated by monitoring the amplitude distribution of sound events in that frequency band.

10 Claims, 9 Drawing Sheets

HEARING AID SIGNAL-PROCESSING SYSTEM

BACKGROUND OF THE INVENTION

The invention relates to hearing aids, and more particularly relates to hearing aids which can be used in noisy environments.

It has long been known to vary the characteristics of a hearing aid in accordance with the ambient noise level so as to make it easier for the patient to distinguish between useful information (i.e. speech) and noise. One system for accomplishing this objective varies the gain at low frequencies when the incoming low frequency energy (which is assumed to be mostly noise) exceeds some predetermined quantity. It has also been proposed to divide the incoming signal into a plurality of frequency bands and to adjust the audio gain for each band in dependance upon the signal-to-noise ratio in that band. Thus, where the signal-to-noise ratio in a particular band is poor, the gain in that band is cut back. Yet another approach involves the formation of a raw estimate of noise level, in which noise is estimated only during pauses between speech sounds.

One problem with these approaches is that they do not take full account of the known effects of noise on speech intelligibility. It has long been known that the effects of low-frequency noise are not restricted to low-frequency speech information. Rather, low-frequency noise also reduces the intelligibility of higher—frequency speech information. While this phenomenon—known as the upward spread of masking effect—is generally applicable to all human beings, it is more severe in hearing-impaired individuals.

It would be advantageous to produce a hearing aid signal processing system which took the phenomenon of spread of masking into account and corrected for it.

SUMMARY OF THE INVENTION

One object of the invention is to provide a hearing aid signal processing system which takes actual account of spread of masking caused by noise.

Another object is to provide such a system which continuously estimates the absolute quantity of noise in incoming audio information rather than using artificial quantities such as signal-to-noise ratios.

Another object is to generally improve on known and proposed signal processing systems for hearing aids.

In accordance with the invention, audio information (such as human speech contaminated by ambient noise) is converted into an electrical signal and this electrical signal is classified (preferably but not necessarily using digital techniques) into a plurality of non-overlapping frequency bands. In further accordance with the invention, the absolute quantity of noise in each frequency band is determined independently, and the gain of each frequency band except for the highest frequency band is adjusted in accordance with the noise so determined. Advantageously, the gain in the next-highest frequency band is adjusted first, the gain of the next lower frequency band is adjusted next, and all of the gains are adjusted from next-highest to lowest.

In further accordance with the invention, the absolute quantity of noise in each frequency band is estimated based on an amplitude histogram.

BRIEF DESCRIPTION OF THE DRAWINGS

Exemplary and non-limiting preferred embodiments of the invention are shown in the drawings, in which.

DETAILED DESCRIPTION OF PREFERRED EMBODIMENT

Figure 1:
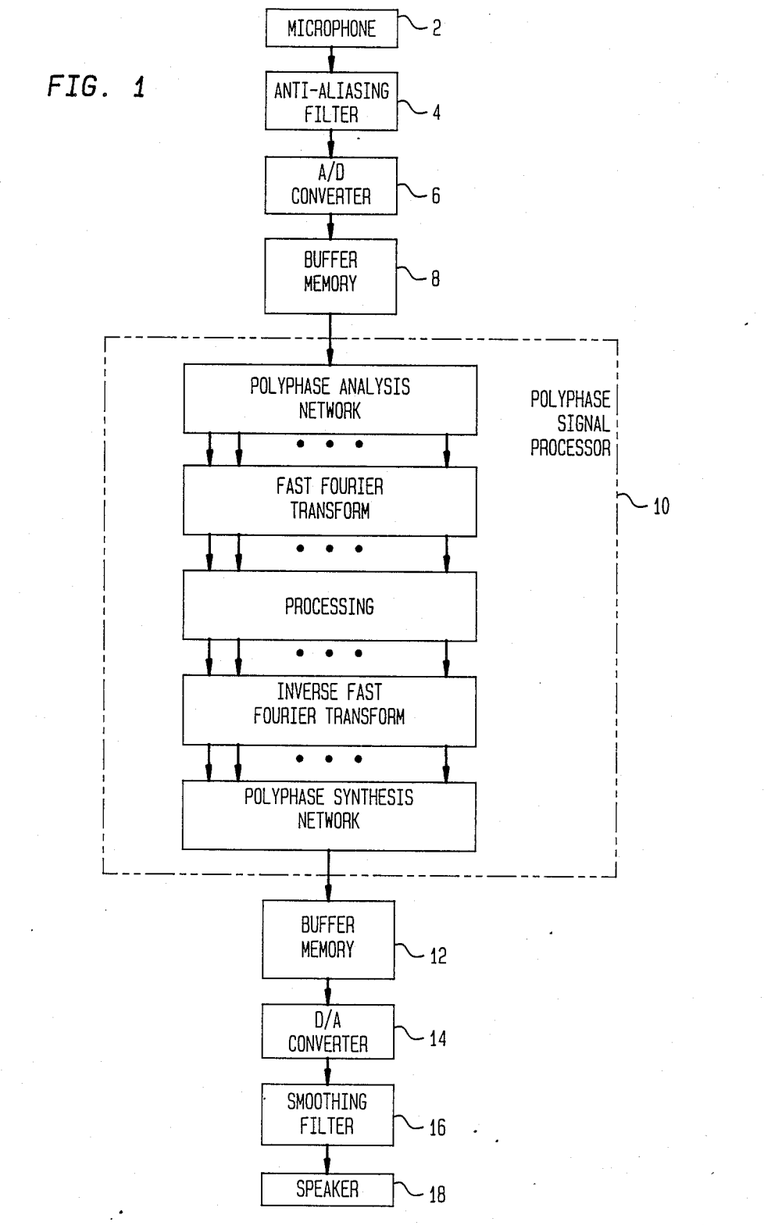
FIG. 1 is an overall block diagram of a preferred embodiment of the invention.

An overall block diagram of a preferred embodiment of the invention will first be discussed in connection with FIG. 1. A microphone 2 converts audio information, which in this instance is assumed to be human speech contaminated by noise, into electrical signals. In the preferred embodiment, these signals are digitized, and to permit this, these signals are sampled, in the preferred embodiment, at the rate of 15 kHz. (This sampling rate is chosen for convenience, and is not part of the invention.) The sampled signals are then directed through an anti-aliasing filter 4. The anti-aliasing filter 4 is a low-pass filter which begins attenuating at approximately 6000 Hz and has a attenuation rate of 18 dB/octave, but these characteristics are not part of the invention. The function of the anti-aliasing filter 4 is to exclude high-frequency signals that cannot be properly represented in the digital system from passing through the rest of the circuitry. Persons skilled in the art are familiar with filters of this type, and the details of the filter 4 will therefore not be further discussed.

After passing through the filter 4 the sampled and filtered signals are input to an analog-to-digital converter 6. In the preferred embodiment, this has a digital resolution of 14 bits, but this is not part of the invention and more or fewer (presently, a minimum of 12 bits are believed to be required but this is not a part of the invention) bits may be used. The digitized signals from the converter 6 are then routed through a buffer memory 8 which accumulates enough information for subsequent signal analysis and signal processing to take place. In the preferred embodiment, the buffer memory 8 holds a block of 16 samples, which corresponds to about 1 mS of information, but this is not part of the invention.

In the preferred embodiment, these signal analysis and signal processing operations are carried out on a Texas Instruments digital signal processing chip TMS 32020, but this is not part of the invention. The signal analysis and signal processing will be discussed in more detail below; for now, the signal analysis and processing functions will be considered to be performed by polyphase signal processor 10.

After the analysis and signal processing have taken place in processor 10, the output information is directed to a buffer memory 12 which accumulates enough information so that the output signal can be converted back to analog form for audio reproduction to the patient. This conversion is carried out in a digital-to-analog converter 14, which is connected to a smoothing filter 16. The smoothing filter 16 is a low-pass type which is known to persons skilled in the art; it smooths out the gaps between successive digitized audio information and in the preferred embodiment has a slope of +18 dB/octave. The details of the smoothing filter 16 will therefore not be described. From the smoothing filter, the information is routed to a speaker 18 which converts the analog signal into audio information.

Figure 2:
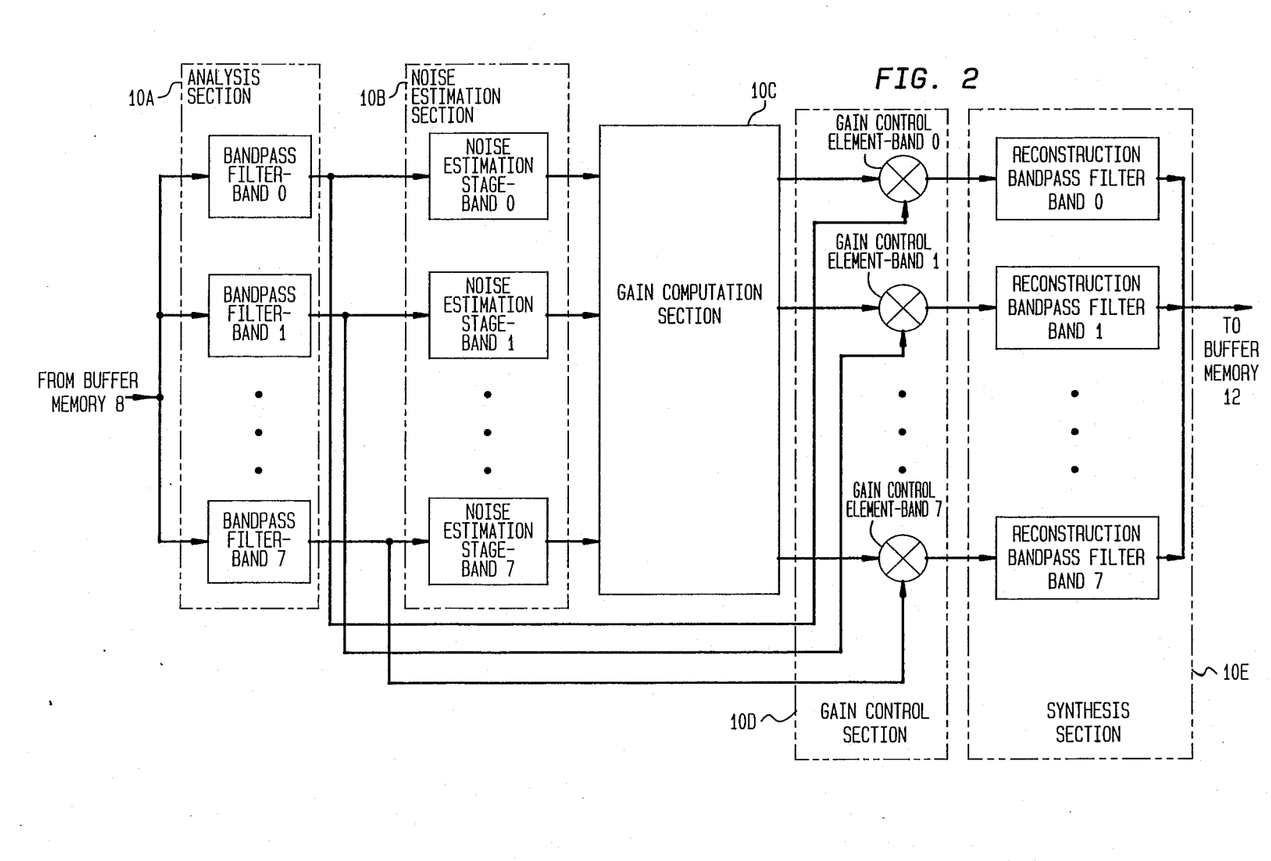
FIG. 2 is a more detailed block diagram of a portion of the preferred embodiment.

FIG. 2 shows the functioning of processor 10 in more detail. While FIG. 1 and subsequent Figures and text illustrate the invention as if individual parts of the processor 10 were embodied in hardware, most of these are actually embodied in software and implemented by the above-mentioned Texas Instruments chip. This is, however, not a part of the invention, and the implementation of various elements as software functions is merely for convenience.

In the preferred embodiment, the signals from the analog-to-digital converter 6 are subjected to multichannel frequency analysis and classified into a plurality of non-overlapping frequency bands in analysis section 10A. (In this example, there are 8 such bands, but this is not part of the invention and another number of bands could be used instead.) Within each such band, the quantity of noise is estimated in noise estimation section 10B as described below, and the gain of the band computed in gain computation section 10C as described below. (The audio gain for the highest frequency band is computed differently from the other bands; this is explained below.) The appropriate audio gain is then applied to signals in each of the frequency bands by gain control elements in gain control section 10D. Then, the output signals from the gain control section 10D are summed in synthesis section 10E, which is connected to the buffer memory 12.

Figure 3:
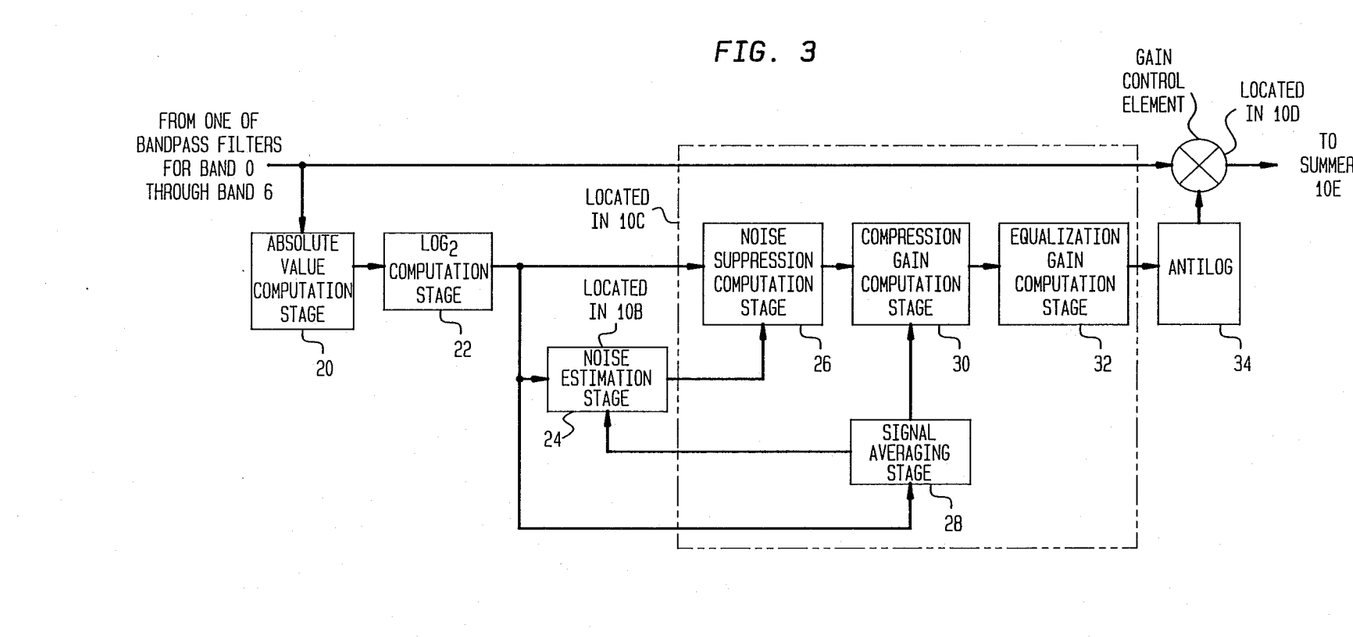
FIG. 3 is a still more detailed block diagram of a portion of the preferred embodiment.

The signal processing operations which are performed in each of the seven lowest frequency bands will now be described in connection with FIG. 3. Initially, the absolute value of the incoming signal is computed in stage 20 and converted to a five bit base 2 logarithm in stage 22. The resolution of this conversion is 0.1875 dB. This is chosen for convenience and is not part of the invention; it comes from dividing 6 dB (the width of each amplitude bin discussed hereinafter) by 32 ($2^5$). The noise in the signal is then estimated in stage 24 as described below and (for all frequency bands except the highest one) suppressed in stage 26 in accordance with an algorithm which is described below. At the same time, the signal is averaged in stage 28 and stage 30 to compute (as described below) the compression gain and noise suppression which is applied to signals within the frequency band to compensate for the patient's hearing deficiencies. This modified signal is then routed through an equalization gain stage 32 which takes the acoustic characteristics of the ear into account so as to avoid unnecessary coloration of the incoming speech. Thereafter, the base 2 anti-logarithm of the equalized signal is computed in stage 34 and used to vary the overall audio gain which is applied to all signals in the frequency band. In the highest frequency band, as is described below, there is no noise suppression, so stage 26 is absent from the operation of the processor 10 on the highest frequency band. However, compression gain and equalization gain for the highest frequency band are computed and FIG. 3 is therefore otherwise accurate as applied to the highest frequency band.

In the following description, the method by which noise is estimated will be discussed in connection with FIGS. 4 and 5 and the method by which the noise is suppressed will be discussed in connection with FIGS. 6 and 7.

As information in the form of digitized sound events comes into the processor 10, each sound event is classified. The classification is by frequency and by amplitude. The classification scheme used by the preferred embodiment is illustrated in FIG. 4. As is shown there, the frequency spectrum between 0 and 6800 Hz is advantageously divided into 8 frequency bands (band 0 through band 7, with band 7 including the highest frequencies) and each frequency band is advantageously divided into 8 amplitude bins (bin 0 through bin 7, with bin 7 including the loudest amplitudes). Thus, if a particular sound has a frequency of 1000 Hz and an amplitude of 42 dB, the event will be classified in band 2, bin 2. It will be understood that there may be more or fewer frequency bands and amplitude bins, that the number of frequency bands and amplitude bins need not be the same, and that the bands may have different frequency boundaries than are shown. These quantities were chosen for convenience and are not part of the invention. FIG. 4 also shows the audiometric frequency which is associated with each band. These audiometric frequencies are not part of the invention, but they are commonly used by audiologists to measure hearing loss at various parts of the frequency spectrum. The audiometric frequencies have been illustrated merely to emphasize the correspondence between the eight preferred frequency bands and the audiometric frequencies which are conventionally used to estimate hearing loss.

In accordance with the invention, the absolute quantity of noise in each band is estimated in accordance with known characteristics of human speech. The amplitude histogram of noise-contaminated human speech is known to have two peaks, one above the other, the lower peak representing noise and the higher-amplitude peak representing speech plus noise.

In the preferred embodiment, "noise" is defined for each frequency band individually by classifying all incoming sound events into amplitude bins and constructing a cumulative amplitude histogram from which an electrical definition of "noise" is derived. Then, the absolute quantity of noise in each frequency band is determined using this definition. The definition is continuously updated so that changing noise conditions do not interfere with the operation of the signal processing system.

Figure 4:
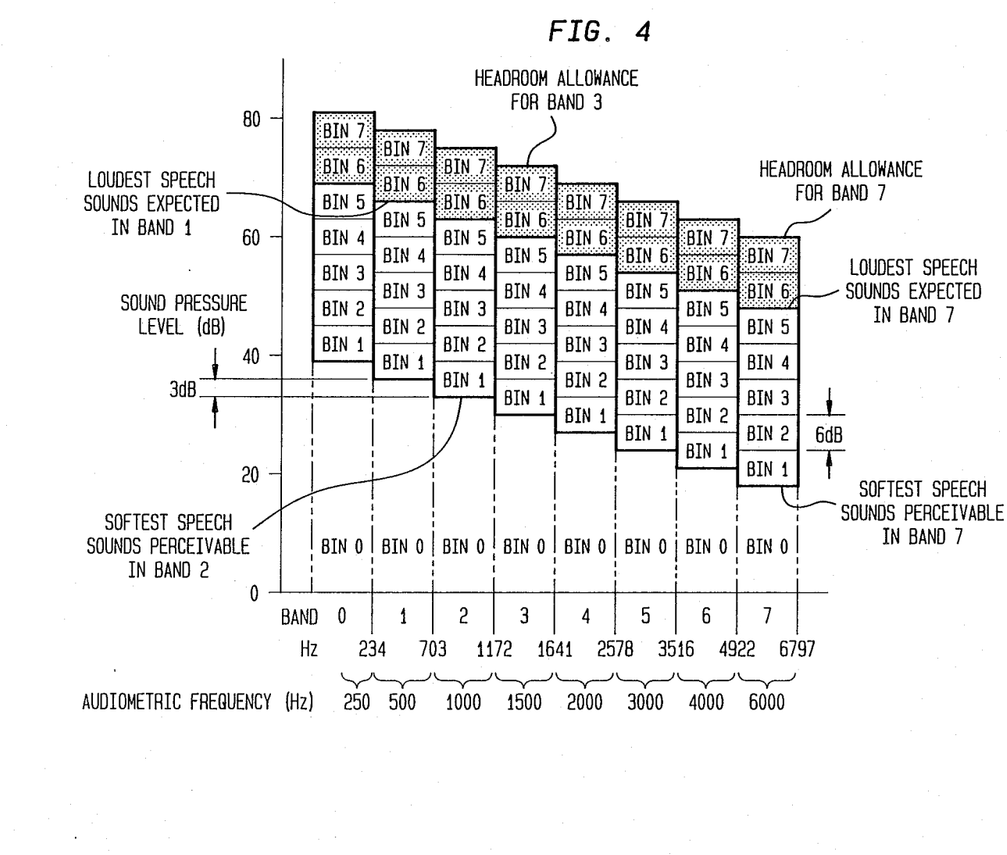
FIG. 4 illustrates the classification of incoming sound events by frequency band and amplitude bin in accordance with the preferred embodiment.
Figure 5:
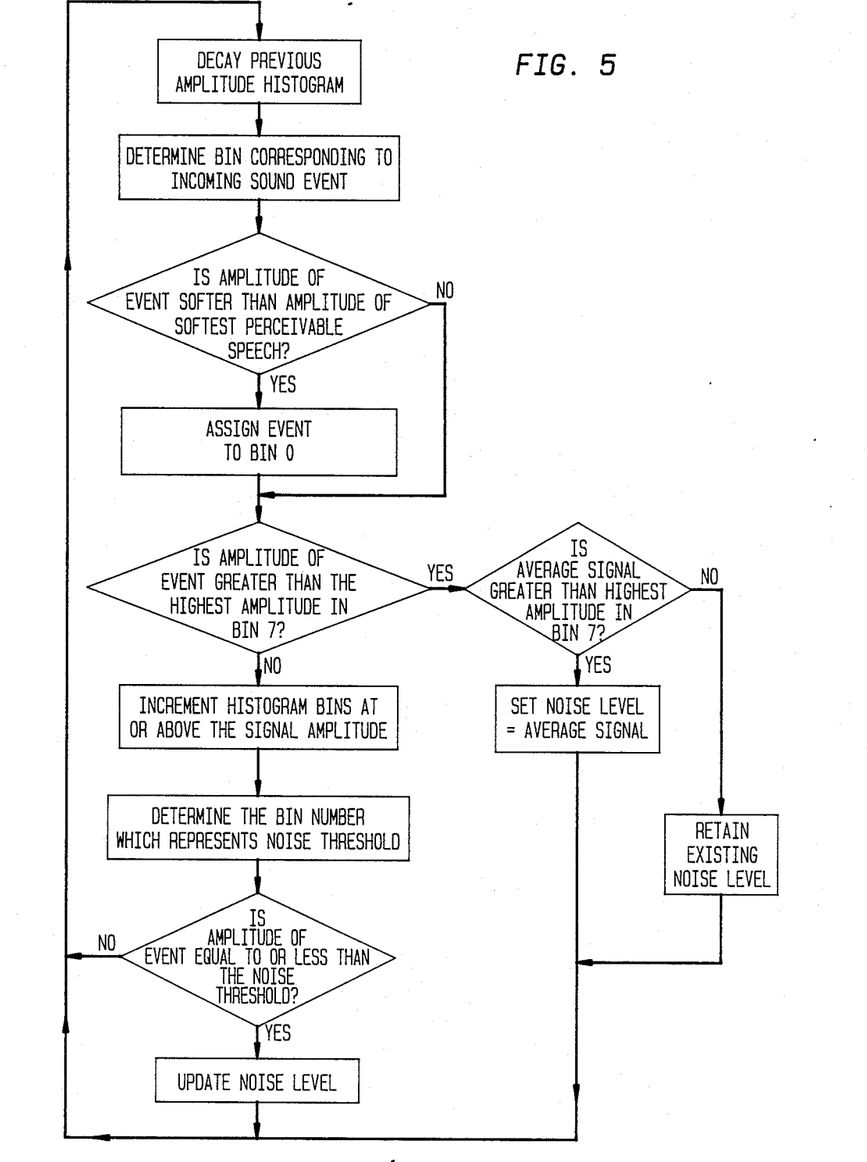
FIG. 5 is a flowchart illustrating the process by which the absolute quantity of noise is determined in each frequency band.

To determine the current definition of noise, incoming audio information is classified into frequency bands and into amplitude bins within each frequency band as is shown in FIG. 4.

Thus, in the preferred embodiment, the system is initialized for a short period which may be as little as one second to as much as 4 seconds, with four seconds being presently preferred and, for each frequency band, a cumulative amplitude histogram is created and then repeatedly decayed at closely spaced intervals (as for example by multiplying the contents of the bin registers by a constant which is less than one). The decay of the histogram is required because the histogram should ideally represent, in real time, the current incoming audio information. If the histogram were to merely be updated as new sound events entered the system, the estimation of current noise levels would be skewed because of previous noise levels which are obsolete when compared with current real-time conditions.

As a new sound event enters the frequency band, it is classified into the appropriate amplitude bin. When the event is of an amplitude which is lower than the softest perceivable speech, the event is treated as if it were the softest perceivable spoken sound. (This has the consequence that such low-amplitude sound events are always treated as noise.)

When the average signal level is lower than the maximum amplitude encompassed by bin 7, the sound event is considered to have the potential of containing either useful speech information or noise, and it is added to the existing cumulative histogram of amplitudes in the frequency band.

It is assumed on an a priori basis that the bins of the cumulative histogram which encompass the lowest amplitude events contain noise. In this preferred embodiment, this assumption is implemented by defining as noise all sound events which are included in those bins which account for at least the lowest 40% of the amplitudes in the cumulative histogram. Thus, if there are a total of 1000 events in a particular cumulative histogram at a particular time, and 400 events are located in bins 0 through 3, it is assumed that all the information in bins 0 through 3 is noise and that all information in bins 4 through 7 contains information which may relate to speech and which may therefore be useful for speech perception.

In practice, this process is carried out by starting at bin 0 and then progressively going to higher bins until the requisite 40% (or more) figure is reached. For example, let it be assumed that the cumulative histogram for a particular frequency band contains 1000 events, of which 100 are classified in bin 0, 200 in bin 1, 300 in bin 2, and 80 each in bins 3–7. The noise threshold must contain the lowest 40% of the events in the histogram or 400 events. Bin 0 contains 100 events, which is less than 400. Bin 1 plus bin 0 contains 300 events, which is likewise less than 400 events. Bin 2 plus bin 1 plus bin 0 contains 600 events, which is equal to, or more than 400 events. Therefore, all events in bins 2, 1 and 0 are considered to be noise and the information in the other bins is considered to be potentially useful for speech perception.

Thus, where a particular sound event has an amplitude which corresponds to bin 2, in this example, the event is considered to be noise and the noise level is updated.

If the event is binned above bin 7, the event may or may not be noise, so a determination is made whether the average signal (measured over a period which is advantageously but not necessarily 50 mS) is louder than the highest amplitude in bin 7. If the average signal is louder than the highest amplitude in bin 7, the entire frequency band is assumed to contain noise alone, and the level of noise in the frequency band is assumed to be equal to the signal level. Thus, the noise identification procedure used in the preferred embodiment has a feature that extremely loud and prolonged sounds are immediately interpreted as noise and it is unnecessary to go through the process by which the noise level is normally determined.

In summary, the absolute quantity of noise in each of the frequency bands is individually and continuously estimated, based on the cumulative distribution of amplitudes in each band. This absolute quantity of noise is used to vary the gains in each of the frequency bands, and this variation will be described next.

In the preferred embodiment, audio gain in each individual frequency band is determined not by the amount of noise in that band alone but rather on the masking effect that such noise has on higher bands. Thus, where excessive noise in band 6 can decrease the intelligibility of speech in band 7, the audio gain in band 6 is cut back to a level at which the band 6 noise is not more than 3 dB louder than the noise in band 7 (or is cut back to the amplitude of the softest perceivable speech sounds in band 6, if this reduction is smaller). Then, the gain in the next lower band, namely band 5, can be adjusted if this is necessary to prevent the noise in band 5 from interfering with the intelligibility of speech sounds in band 6.

Figure 6:
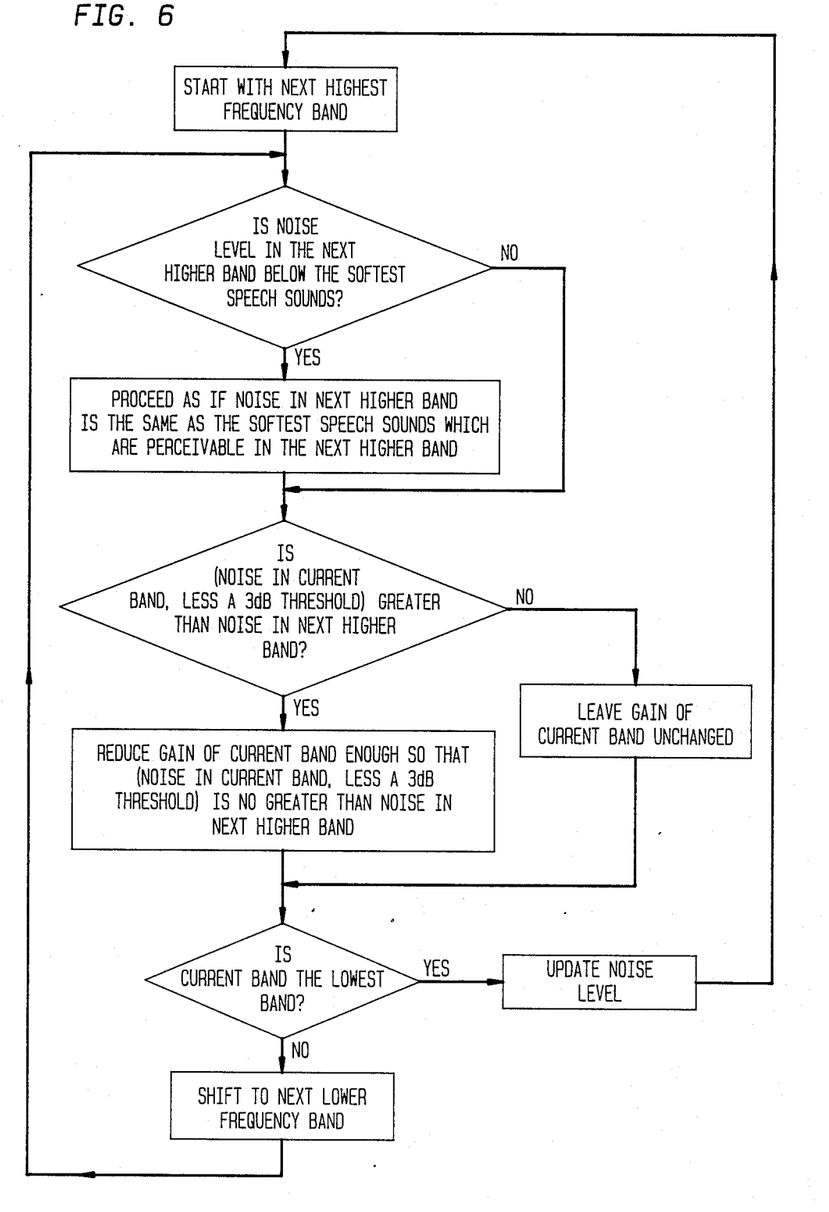
FIG. 6 is a flowchart illustrating the algorithm by which the preferred embodiment corrects for upward spread of masking of noise.

The flowchart in FIG. 6 will make this clearer. It will be noted that the audio gain of the highest band, namely band 7, is never adjusted to compensate for noise. This is because band 7 is assumed to contain the highest frequency speech sounds and noise in this band has no effect on intelligibility of higher-frequency speech sounds. (The gain of band 7 is adjusted to compensate for the patient's hearing deficiencies, as described below.)

Beginning in this example with band 6 as the current band, the determination is first made whether the noise level in the next higher band (here band 7) is softer than the softest perceivable speech sound in band 7. If so, the noise level is treated as if it is as loud as the softest speech sounds which can be perceived in band 7. (This is not an essential part of the invention, but is done for convenience, as is explained below.)

The decision is then made whether noise in the current band, here band 6, less a threshold which in this example is 3 dB, is louder than the noise in the next higher band, here band 7. If not, there is insufficient noise in band 6 to cause intelligibility problems in band 7 and the gain in band 6 need not be, and is not, adjusted. However, if the noise in the current band, less the 3 dB threshold, is louder than the noise in the next higher band, i.e. band 7, the noise level in band 6 is such as to interfere with the intelligibility of speech sounds in band 7. In this case, the gain in band 6 is reduced enough so that the noise in band 6, less 3 dB, is not louder than the noise in band 7.

This process is then repeated by setting band 5 as the current band and repeating the same process of comparing the noise in the current band (now band 5) with the noise in the next higher band (including any gain adjustment) (here, band 6). The same process is then repeated for successively lower bands until the noise in band 0 has been evaluated and the gain in band 0 adjusted if necessary.

Figure 7:
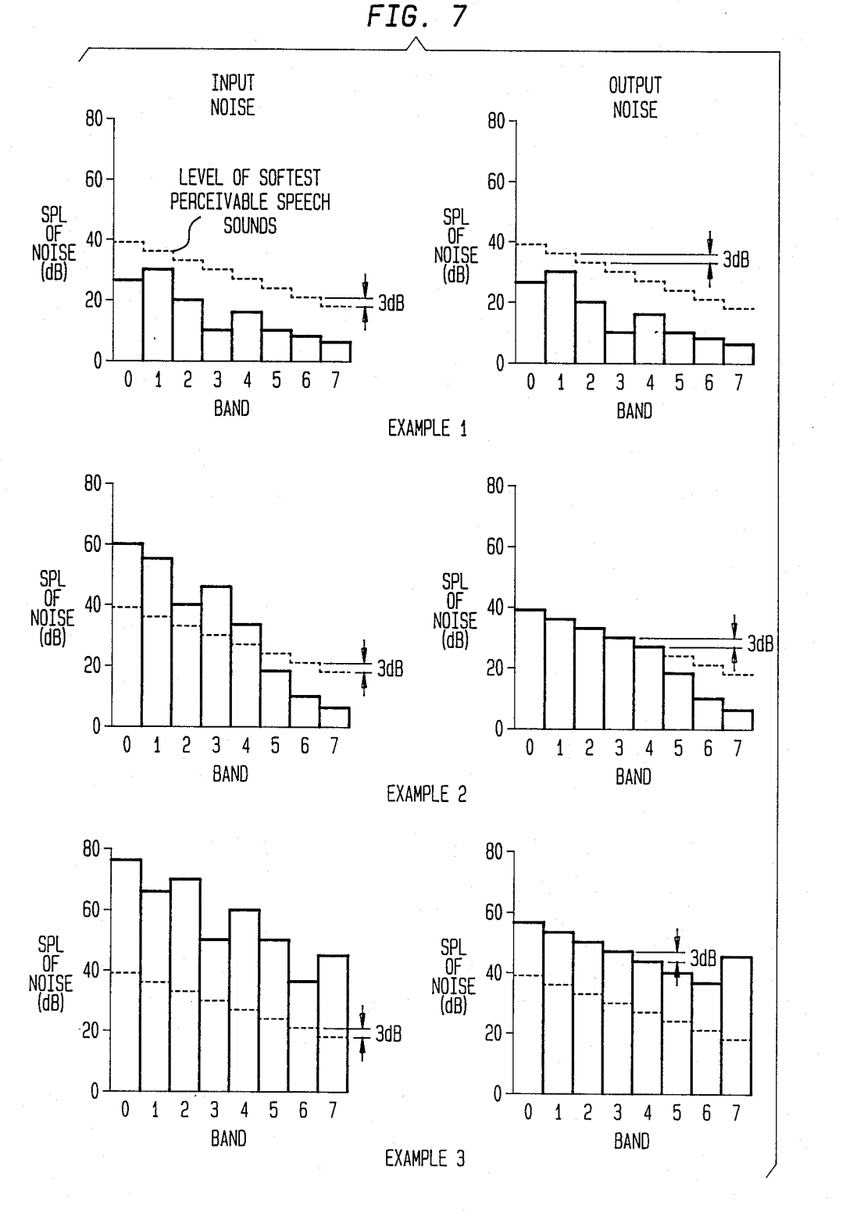
FIG. 7 illustrates the results produced by the preferred embodiment in three different situations.

The effect of this algorithm are illustrated in FIG. 7. In Example 1, the noise in each frequency band is far below the amplitude of the softest perceivable speech sounds and therefore cannot affect intelligibility of speech sounds in any band. Therefore, no audio gain of any band is reduced to compensate for the effects of noise. This comes about because, for purposes of signal processing, the noise in each band is treated as if it were at the same loudness as the softest perceivable speech sounds in the band. Therefore, it is unimportant that, for example, the noise in band 2 exceeds the noise in band 3 by more than 3 dB. In short, noise levels which are below the softest perceivable speech sounds are treated as if they were all equally inaudible and only audible noise levels, i.e. noises which are louder than such sounds, are reduced. The reduction takes place only until the relevant noise level reaches the threshold of audibility.

In Example 2, the noise in each of the frequency bands 5, 6 and 7 is softer than the softest Perceivable speech sounds in those bands so the audio gains of frequency bands 5, 6 and 7 are not reduced. However, the noise level in band 4 is more than 3 dB louder than the noise in band 5 and will therefore cause masking in band 5. Accordingly, the audio gain applied to signals in frequency band 4 is reduced. It will be noted that there is more than 3 dB difference between the output (processed) noise levels in bands 4 and 5, but the audio gain of band 4 is only cut back to the point where the noise in band 4 becomes as loud as the softest speech sounds which are perceivable in band 4. Further reduction is unnecessary. The process then continues for bands 3, 2, 1 and 0. In each case, the noise level in the band exceeds the noise in the next higher band by more than 3 dB, and the audio gain applied to signals in the frequency band is then cut back.

In Example 3, it will be noted that the noise in band 6 is less than the noise in band 7. As a result, the gain in band 6 is left unchanged. In all remaining bands, the noise level in the current band exceeds the (reduced) noise level in the next higher band by more than 3 dB, and the audio gain in the current band is reduced to eliminate the effect of masking.

The threshold value of 3 dB is not a part of the invention. This value is set at 3 dB because this has been determined empirically to be the value which gives the least tonal coloration to the processed sound. However, the threshold may be set higher or lower.

The preferred embodiment is designed to improve the intelligibility of noise-contaminated speech and also to correct for the particular hearing impairments of the user. This latter correction is carried out in all frequency bands, and not only in the seven lowest ones.

In the simplest case, it would be possible to measure the degree of hearing loss in each frequency band and to apply an appropriate amplification to signals in each frequency band so as to compensate for that loss. However, this solution is unsatisfactory. Whereas this would provide adequate results for average speech levels, softer speech sounds might not be sufficiently amplified so as to be made perceivable by the patient, and louder speech sounds might be amplified to an uncomfortable degree.

For this reason, the preferred embodiment of the invention utilizes an adaptive amplification system which adjusts the gain applied to sound events in a particular frequency band in accordance with the amplitude of such events. The principle of this adaptive amplification is illustrated in FIG. 8.

Figure 8:
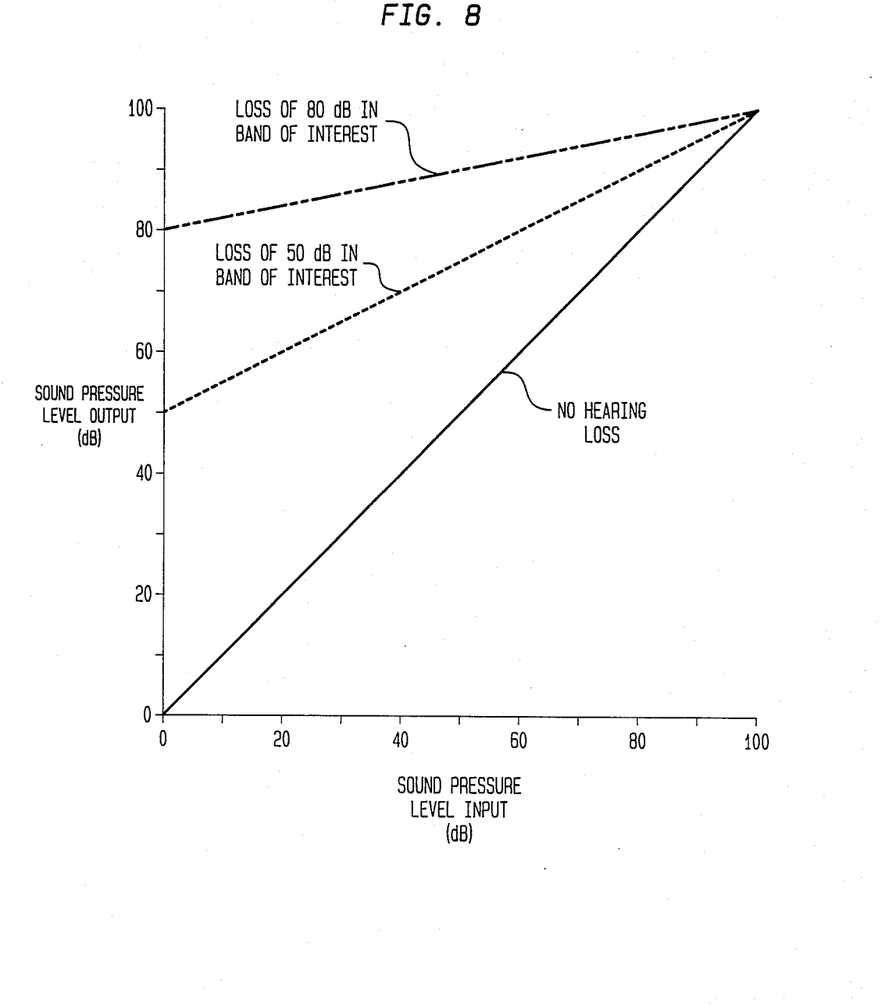
FIG. 8 illustrates the concept of compression gain.

FIG. 8 shows three individual cases in a particular frequency band of interest. Where the patient's hearing is unimpaired in frequency band of interest, there is a linear relationship between input and output and no adjustment of gain is necessary or desirable. For a patient with a loss of 50 dB in the frequency band of interest, softer speech sounds are amplified more than are louder speech sounds. Thus, the softest perceivable speech sounds are amplified by 50 dB and the loudest speech sounds of perhaps 100 dB are not amplified at all. In the most extreme case illustrated, which is a loss of 80 dB in the frequency band of interest, the variation in amplification is much greater; soft sounds are amplified by as much as 80 dB while loud sounds of e.g. 100 dB are not amplified at all.

Figure 9:
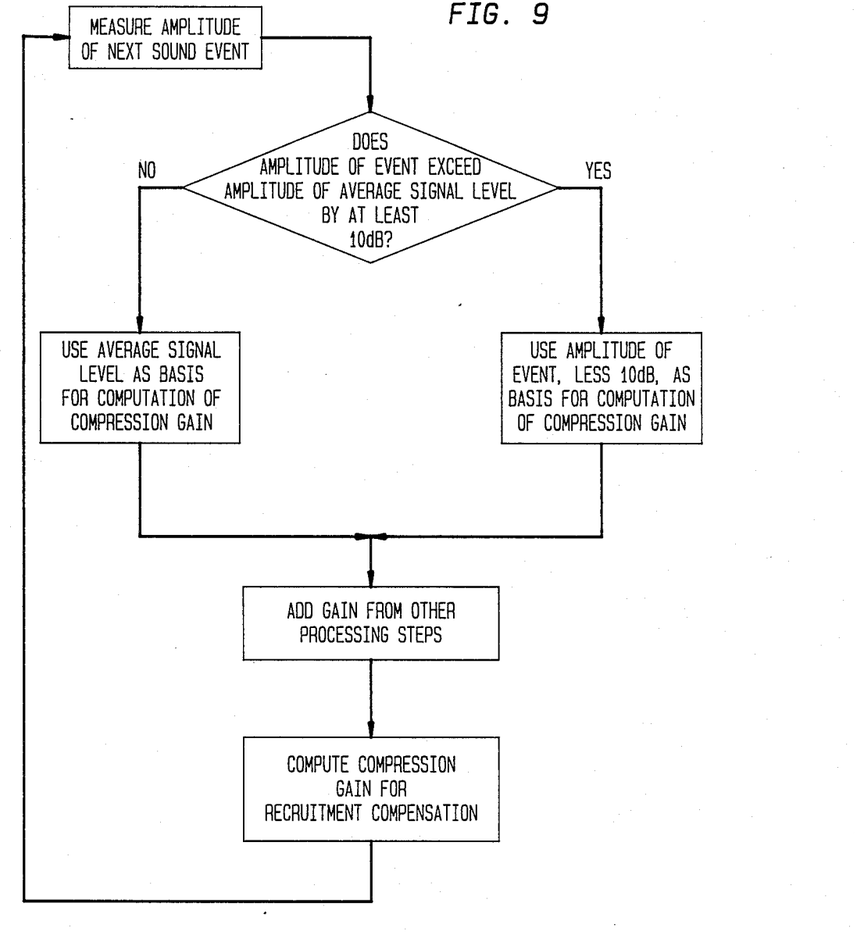
FIG. 9 is a flowchart illustrating the method by which compression gain is calculated in the preferred embodiment.

In accordance with the preferred embodiment of the invention, an audiologist measures the patient's hearing loss in each of the frequency bands and appropriate gain vs. amplitude response curves are derived and programmed into the stage 30. Then, the audio gain applied to the processed signals in each frequency band is adjusted in accordance with the flowchart illustrated in FIG. 9. In this method, the average signal is continuously computed over a time constant of 50 mS. If a particular sound event is substantially louder than the ambient signal level (in this case more than 10 dB above the average signal level) the amplitude of the sound event less the 10 dB threshold is used as the basis for computation of the gain to be applied. Where the instantaneous signal is not much greater than the average signal, the average signal is used as the basis for computing gain.

Those skilled in the art will understand that changes can be made in the preferred embodiments here described, and that these embodiments can be used for other purposes. Such changes and uses are within the scope of the invention, which is limited only by the claims which follow.

What is claimed is:

1. A signal-processing system for use in hearing aids, comprising:
    means for producing an electrical signal from human speech and ambient noise;
    means for classifying said electrical signal into a plurality of non-overlapping frequency bands, which plurality contains a highest frequency band, a next-highest frequency band and a lowest frequency band;
    means for estimating an absolute quantity of noise in each frequency band; and
    means for individually varying, as a function of noise estimated by said estimating means, audio gain in each frequency band except the highest frequency band, said varying means comprising means for comparing an absolute quantity of noise in each frequency band except the highest frequency band with an absolute quantity of noise in the next higher frequency band.

2. The system of claim 1, wherein said estimating means comprises means for establishing an amplitude histogram in the frequency band in which the absolute quantity of noise is to be estimated, and further comprises means for comparing an average signal amplitude with a predetermined quantity and means for setting said absolute quantity of noise at said average signal amplitude when said average signal amplitude exceeds said predetermined quantity.

3. The system of claim 1, wherein said varying means further comprises means for determining whether the absolute quantity of audible noise in a current frequency band in which gain is to be adjusted exceeds the absolute quantity of audible noise in a next higher frequency band by more than a predetermined threshold value.

4. The system of claim 3, wherein said varying means operates in a manner that when the absolute quantity of audible noise in a current frequency band in which gain is to be adjusted exceeds the absolute quantity of audible noise in a next higher frequency band by more than said predetermined threshold value, said gain is reduced.

5. The system of claim 4, wherein said varying means operates in a manner that when the absolute quantity of audible noise in a current frequency band in which gain is to be adjusted exceeds the absolute quantity of audible noise in a next higher frequency band by more than said predetermined threshold value, said gain is reduced to a value at which the absolute quantity of noise in the current frequency band is approximately as loud as the softest speech sounds which can be perceived in said current frequency band.

6. The system of claim 4, wherein said threshold value is 3 dB.

7. A signal processing system for use in hearing aids, comprising:
   means for converting incoming audio information into digital signals;
   means for classifying said signals by frequency and by amplitude into a plurality of non-overlapping frequency bands and a plurality of non-overlapping amplitude bins within each frequency band, said plurality of said frequency bands including a highest frequency band, a next-highest frequency band and a lowest frequency band;
   means for establishing an amplitude bin histogram for each of the frequency bands;
   means for estimating an absolute quantity of audible noise in each frequency band, based upon a corresponding one of the histograms;
   means for comparing said absolute quantity of audible noise in each band except the highest frequency band with the absolute quantity of audible noise in the next-higher frequency band and determining whether the absolute quantity of audible noise in the lower frequency band exceeds the absolute quantity of audible noise in said next higher frequency band by more than a predetermined threshold value;
   means for individually varying audio gain of signals in each frequency band; and
   means for operating said varying means in a manner that when, for a particular frequency band, said absolute quantity of audible noise in the lower frequency band exceeds the absolute quantity of audible noise in said next higher frequency band by more than said predetermined threshold value, said audio gain in said particular frequency band is reduced.

8. The system of claim 7, wherein said estimating means includes means for measuring an average amplitude of said signals over a relatively short period of time and setting said absolute quantity of noise equal to said average amplitude when said average amplitude exceeds a predetermined maximum headroom amplitude.

9. The system of claim 7, wherein said establishing means further comprises means for decaying said histograms over time.

10. The system of claim 9, wherein said decaying means operates in a manner that each histogram represents 4 seconds of audio information.

* * * * *

UNITED STATES PATENT AND TRADEMARK OFFICE
CERTIFICATE OF CORRECTION

PATENT NO. : 4,852,175

DATED : July 25, 1989

INVENTOR(S) : KATES

It is certified that error appears in the above-identified patent and that said Letters Patent is hereby corrected as shown below:

On the cover page, insert --[73] Assignee: Siemens Hearing Instruments, Inc., Piscataway, N.J.--;

Cover Page, Attorney's Name: insert --Mark H. Jay--.

Signed and Sealed this

Twelfth Day of June, 1990

Attest:

HARRY F. MANBECK, JR.

*Attesting Officer*　　　*Commissioner of Patents and Trademarks*